US012720899B2

(12) United States Patent
Wang

(10) Patent No.: US 12,720,899 B2
(45) Date of Patent: Aug. 25, 2026

(54) METHOD OF MANUFACTURING SEMICONDUCTOR PACKAGE, SEMICONDUCTOR PACKAGE, AND IMAGING APPARATUS

(71) Applicant: Samsung Electronics Co., Ltd., Suwon-si (KR)

(72) Inventor: Wenjun Wang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 894 days.

(21) Appl. No.: 17/746,290

(22) Filed: May 17, 2022

(65) Prior Publication Data

US 2023/0326948 A1 Oct. 12, 2023

(30) Foreign Application Priority Data

Apr. 6, 2022 (CN) ........................ 202210355747.3

(51) Int. Cl.

*H10F 39/00* (2025.01)
*H01L 23/00* (2006.01)
*H10W 72/00* (2026.01)
*H10W 72/30* (2026.01)

(52) U.S. Cl.

CPC .......... *H10F 39/811* (2025.01); *H10F 39/011* (2025.01); *H10W 72/07333* (2026.01); *H10W 72/07341* (2026.01); *H10W 72/352* (2026.01)

(58) Field of Classification Search

CPC ......... H10W 90/794; H10W 72/07333; H10W 72/07341; H10W 72/352; H10W 72/0711; H10W 72/07141; H10W 72/90; H10W 72/923; H10W 72/957; H10W 72/019; H10W 80/701

See application file for complete search history.

(56) References Cited

U.S. PATENT DOCUMENTS 7,091,571 B1 8/2006 Park et al.
7,663,083 B2 2/2010 Kwon et al.
8,110,911 B2 2/2012 Ishihara et al.
(Continued)

FOREIGN PATENT DOCUMENTS

KR 101632343 B1 6/2016

*Primary Examiner* — Leonard Chang
*Assistant Examiner* — Stanetta D Isaac
(74) *Attorney, Agent, or Firm* — Harness, Dickey & Pierce, P.L.C.

(57) ABSTRACT

A semiconductor package and a method of manufacturing the same, and an imaging apparatus are provided. The method includes preparing a substrate having a first connection region and a sensor chip having a second connection region. A first bonding layer including multi-layer nano low-melting-point metal materials with different melting point gradients is provided on the first connection region. A second bonding layer including multi-layer nano low-melting-point metal materials with different melting point gradients is provided on the second connection region. The substrate and the sensor chip are overlapped to align and tightly compress the first and second bonding layers, to obtain a composite structure. The composite structure is treated at a temperature of 30 to 180° C., under a pressure of 1 to 8 MPa, and with an ultrasonic of 10 to 30 kHz to form the first and second bonding layers into a eutectic.

12 Claims, 7 Drawing Sheets

(56) References Cited

U.S. PATENT DOCUMENTS

2010/0295178 A1* 11/2010 Ishihara ................. H05K 1/187
257/737
2011/0096223 A1 4/2011 Fu
2020/0227462 A1* 7/2020 Haneda ................... H01L 24/05
2020/0366853 A1 11/2020 Song et al.

* cited by examiner

METHOD OF MANUFACTURING SEMICONDUCTOR PACKAGE, SEMICONDUCTOR PACKAGE, AND IMAGING APPARATUS

CROSS-REFERENCE TO RELATED APPLICATION

This application is based on and claims priority under 35 U.S.C. § 119 to Chinese Patent Application No. 202210355747.3, filed on Apr. 6, 2022, in the Chinese Intellectual Property Office, the disclosure of which is incorporated by reference herein in its entirety.

BACKGROUND

1. Field

Example embodiments relate to semiconductor packaging, and in particular, to a method of manufacturing a semiconductor package, and a semiconductor package and an imaging apparatus including the same.

2. Description of the Related Art

Recently, as consumer electronic products are developed toward miniaturization, packaging for semiconductor chips is also developed toward miniaturization and micro-miniaturization. In the field of the packaging for camera chips, ultra-thin packaging has become an evolving trend, and how to reduce a package thickness of a camera chip has become a focus in the industry.

Currently, the packaging for camera chips mainly includes chip-on-board (COB) packaging, flip-chip packaging, and the like. FIG. 1 illustrates a top view of a package structure formed by bonding a sensor chip to a substrate using a COB packaging method of the prior art. FIG. 2 illustrates a side view of the package structure formed by bonding the sensor chip to the substrate using the COB packaging method of the prior art. As shown in FIGS. 1 and 2, a sensor chip 1 is coupled onto a substrate 2 by an adhesive layer, and then pads 3 of the sensor chip 1 and pads 4 of the substrate 2 are electrically connected to each other by wires 5 through a wire bonding process. The wires 5 may generally include gold wires. However, a certain space is occupied due to high arcs of the wires of the COB package, which is not favorable to ultra-thinning of the package, and meanwhile, there are also problems for the wires, such as stray light interference caused by light reflection, etc.

Accordingly, in order to overcome the above disadvantages of the COB packaging method, a flip-chip process is now applied to the packaging of some advanced cameras. FIG. 3 illustrates a cross-sectional view of a package structure formed by bonding a sensor chip to a substrate using a flip-chip packaging method of the prior art. As shown in FIG. 3, spherical bumps 5 are firstly prepared on pads 3 of a sensor chip 1. Then, the spherical bumps 5 on the sensor chip 1 are aligned and connected with pads 4 of a substrate 2 by using special processes, such as hot pressing, ultrasonic process, etc. Finally, an insulating adhesive is coated around the sensor chip 1 for encapsulation by using an adhesive injection process, so as to improve reliability. Since the chip is embedded in a flip form within a window of the substrate by the flip-chip process, a package thickness of the chip may be significantly decreased, thereby further reducing an overall height of a camera module. However, it is necessary to prepare spherical bumps for the flip-chip process, and a gold ball has generally a height of 10 μm to 50 μm. Although the height of the gold ball may be decreased as much as possible by controlling the process conditions, the gold ball has to be maintained at a certain height. In addition, the flip-chip process requires the use of various processes such as high temperature, high pressure, and ultrasonic process, and thus is complicated and costly, and has high energy consumption.

The above information disclosed in this Background section is only for enhancing the understanding of the background of the present inventive concepts, and therefore, it may contain information that does not form the prior art that is already known in this country to a person of skill in the art.

SUMMARY

Example embodiments disclose a method of manufacturing a semiconductor package in which the above problems of the prior packaging processes, such as complexity in the process, high energy consumption, high cost, etc., can be addressed.

Example embodiments also disclose a semiconductor package and an imaging apparatus including the same, which is capable of achieving ultra-thin packaging.

Embodiments are directed to a method of manufacturing a semiconductor package, the method comprising: preparing a substrate with a first connection region and a sensor chip with a second connection region; providing, on the first connection region of the substrate, a first bonding layer having a melting point gradient and including a plurality of layers of nano low-melting-point metal materials; providing, on the second connection region of the sensor chip, a second bonding layer having a melting point gradient and including a plurality of layers of nano low-melting-point metal materials; overlapping the substrate and the sensor chip with each other to align and tightly compress the first bonding layer and the second bonding layer with each other, to obtain a composite structure; and treating the composite structure at a temperature of 30° C. to 180° C., under a pressure of 1 MPa to 8 MPa, and with an ultrasonic of 10 kHz to 30 kHz for a period of time to form the first bonding layer and the second bonding layer into a eutectic.

Furthermore, the layers of nano low-melting-point metal materials of each of the first and second bonding layers may have melting points decreasing as farther away from respective one of the first and second connection regions.

Furthermore, each of the layers of nano low-melting-point metal materials of each of the first and second bonding layers may include one of gold (Au), silver (Ag), aluminum (Al), copper (Cu), zinc (Zn), tin (Sn), lead (Pb), antimony (Sb), bismuth (Bi), lithium (Li), indium (In), magnesium (Mg), gallium (Ga), cadmium (Cd), and an alloy thereof.

Furthermore, the nano low-melting-point metal materials of the first bonding layer may be different from the nano low-melting-point metal materials of the second bonding layer.

Furthermore, each of the layers of nano low-melting-point metal materials of each of the first and second bonding layers may have a thickness of 10 nm to 800 nm.

Furthermore, the treating the composite structure may include increasing stepwise the temperature to reach a final reaction temperature, and may include at least one temperature-holding stage before reaching the final reaction temperature.

Embodiments are directed to a semiconductor package, the semiconductor package comprising: a substrate including a first connection region; a sensor chip including a second connection region; a first bonding layer on the first connection region; and a second bonding layer on the second connection region, wherein the substrate and the sensor chip are coupled to each other by forming a eutectic from the first bonding layer and the second bonding layer, and wherein the first bonding layer and the second bonding layer each have a melting point gradient and include a plurality of layers of nano low-melting-point metal materials.

Furthermore, the layers of nano low-melting-point metal materials of each of the first and second bonding layers may have melting points decreasing as farther away from respective one of the first and second connection regions.

Furthermore, the substrate may include a first portion and a second portion each in an inverted L shape, the first and second portions being disposed opposite to each other to form a window, and the sensor chip being internally positioned in the window.

Furthermore, the first connection region may be on inner surfaces of the first portion and the second portion of the substrate, the second connection region may be on an upper surface of the sensor chip, and the first connection region and the second connection region may be aligned and bonded with each other in a vertical direction.

Furthermore, the nano low-melting-point metal materials of each of the first and second bonding layers have melting points that decrease as they are farther away from a respective one of the first and second connection regions.

Embodiments are directed to an imaging apparatus including a camera module, the camera module including the semiconductor package described as above.

BRIEF DESCRIPTION OF THE DRAWINGS

The features and advantages of the above and other aspects of the inventive concepts will become apparent from the following detailed description of some example embodiments thereof in conjunction with the accompanying drawings. In the drawings, like reference numerals will denote like elements throughout the specification.

DETAILED DESCRIPTION

Figure 1:
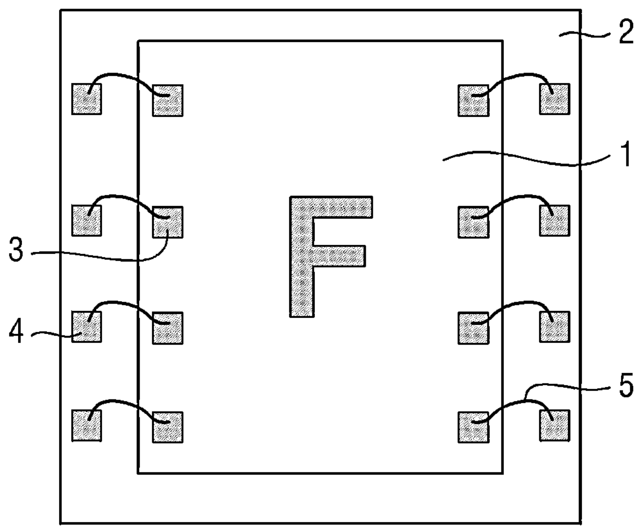
FIG. 1 illustrates a top view of a package structure formed by bonding a sensor chip to a substrate using a COB packaging method of the prior art.
Figure 2:
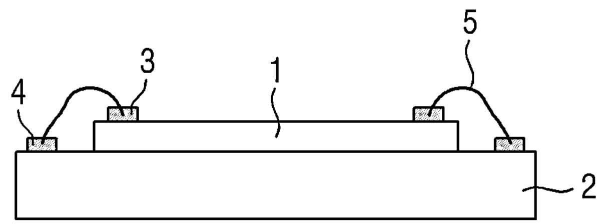
FIG. 2 illustrates a side view of the package structure formed by bonding the sensor chip to the substrate using the COB packaging method of the prior art.
Figure 3:
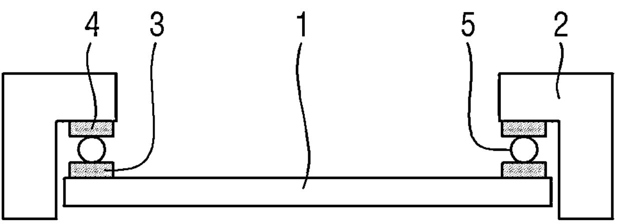
FIG. 3 illustrates a cross-sectional view of a package structure formed by bonding a sensor chip to a substrate using a flip-chip packaging method of the prior art.

Hereinafter, various embodiments of the present inventive concepts will be described more fully with reference to the drawings, in which certain embodiments are illustrated. However, the present inventive concepts may be embodied in many different forms, and should not be interpreted as being limited to the embodiments set forth herein. Rather, these embodiments are provided such that the description will be thorough and complete, and will convey the scope of the present inventive concepts to those skilled in the art. In the drawings, sizes of layers and regions may be exaggerated for clarity.

For ease of description, spatially relative terms, such as "beneath," "below," "under," "lower," "above," "upper," and the like, may be used herein to describe one element's relationship to another element(s) as illustrated in the drawings. It will be understood that the spatially relative terms are also intended to encompass different orientations of a device in use or manufacture in addition to the orientation depicted in the drawings. For example, if the device in the drawings is turned over, elements described as "below" or "beneath" another element would then be oriented "above" the other element. Thus, the term "below" can encompass both an orientation of "above" and "below". The device may be otherwise oriented (e.g., rotated 90 degrees or at other orientations), and the spatially relative descriptors used herein may be interpreted accordingly.

Hereinafter, a method of manufacturing a semiconductor package according to some example embodiments will be described in detail with reference to FIGS. 4-7.

Figure 4:
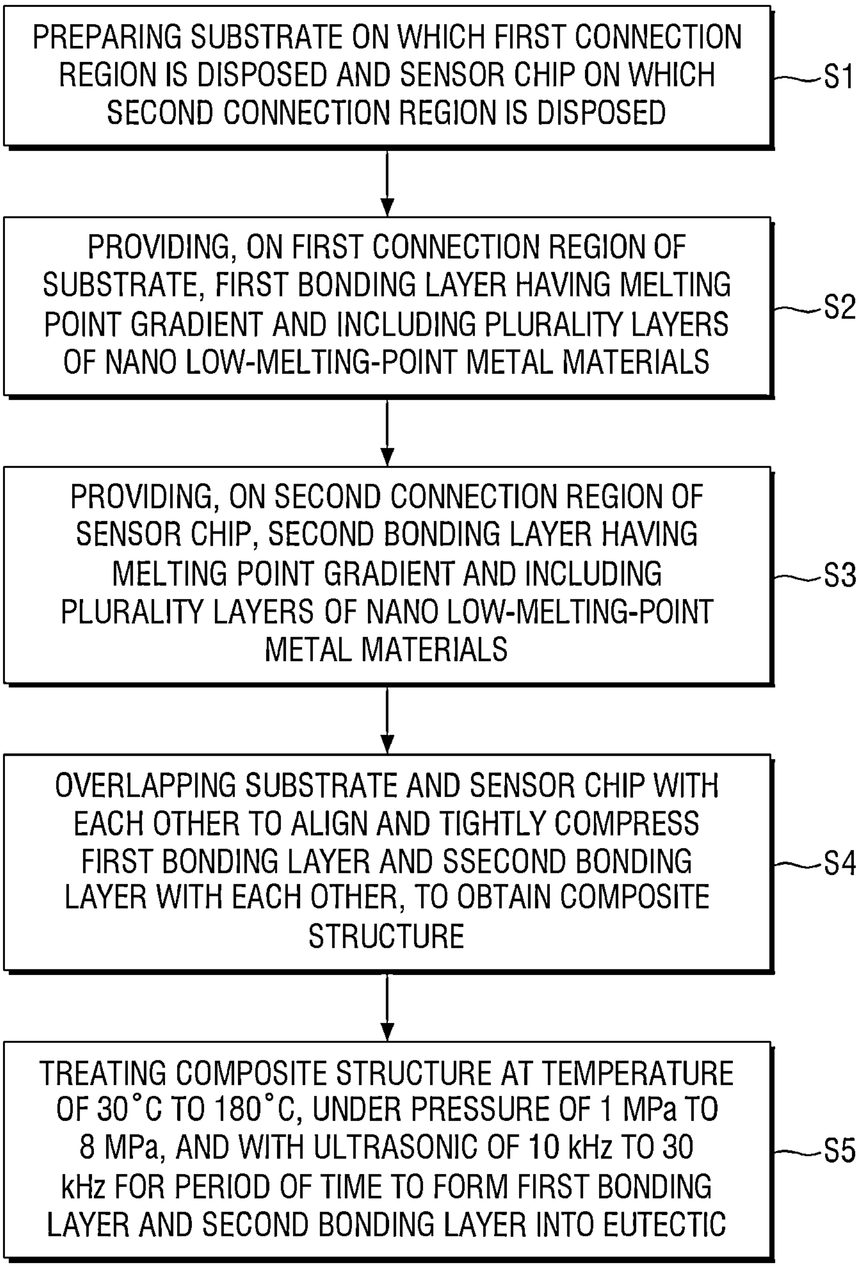
FIG. 4 illustrates a process flowchart of a method of manufacturing a semiconductor package according to example embodiments.

FIG. 4 illustrates a process flowchart of a method of manufacturing a semiconductor package according to example embodiments. As illustrated in FIG. 4, the method of manufacturing the semiconductor package according to the example embodiments includes, in step S1, preparing a substrate on which a first connection region is disposed and a sensor chip on which a second connection region is disposed. In an implementation, the substrate may be a substrate commonly used for manufacturing a semiconductor package in the related art. The substrate may include various materials and configurations commonly used in the art. In an implementation, the sensor chip may be any type of image sensor chip commonly used in an imaging apparatus of an electronic product in the art. However, the embodiments are not limited thereto, and the substrate and the sensor chip may further include all of modified implementations and equivalent arrangements encompassed within the inventive concepts.

Next, in step S2, a first bonding layer having a melting point gradient and including a plurality of layers of nano low-melting-point metal materials with different melting points is provided on the first connection region of the substrate. In step S3, a second bonding layer having a melting point gradient and including a plurality of layers of nano low-melting-point metal materials is provided on the second connection region of the sensor chip. In an implementation, steps S2 and S3 are not limited to the order described herein. Steps S2 and S3 may be simultaneously performed in the same process, or step S2 may be performed after step S3 is performed. In an implementation, the first bonding layer and the second bonding layer may be provided on the first connection region and the second connection region, respectively, by a coating process. Here, the coating process may be a process of preparing a nano-coating commonly used in the related art. The coating process may also be a physical or chemical filming process commonly used in the related art, such as a plasma coating process, a chemical vapor deposition process, a physical sputtering process, or the like.

In an implementation, the steps of providing the first bonding layer and the second bonding layer may include coating a plurality of layers of nano low-melting-point metal materials with different melting points on the first and second connection regions, respectively, using the coating process. The plurality of layers of nano low-melting-point metal materials of each of the first and second bonding layers may include at least two metal layers, for example, three, four, or more metal layers. The layers may have melting points decreasing as farther away from the first or second connection region, to form a melting point gradient.

In an implementation, each of the plurality of layers of nano low-melting-point metal materials for forming either of the first and second bonding layers may include one of gold (Au), silver (Ag), aluminum (Al), copper (Cu), zinc (Zn), tin (Sn), lead (Pb), antimony (Sb), bismuth (Bi), lithium (Li), indium (In), magnesium (Mg), gallium (Ga), cadmium (Cd), and an alloy thereof. In an implementation, the first bonding layer and the second bonding layer may be formed of the same nano low-melting-point metal materials or different nano low-melting-point metal materials, as long as the selected nano-metal materials can form the melting point gradient that satisfies the process requirement.

In an implementation, each of the plurality of layers of nano low-melting-point metal materials may be formed to have a thickness ranging from 10 nm to 800 nm. The thicknesses of respective layers of the plurality of layers of nano low-melting-point metal materials may be different depending on changes of properties of the used metals and process conditions, as long as it can be ensured that eutectic melting may occur in the first and second bonding layers at a lower temperature so as to form a eutectic.

Next, in step S4, the substrate and the sensor chip are overlapped with each other to align and tightly compress the first bonding layer and the second bonding layer with each other, so that a composite structure is obtained. In step S5, the obtained composite structure is treated at a temperature of 30° C. to 180° C., under a pressure of 1 MPa to 8 MPa, and with an ultrasonic of 10 kHz to 30 kHz for a period of time to form the first and second bonding layers into a eutectic.

The method of manufacturing the semiconductor package according to the example embodiments of the present inventive concepts can adopt three process conditions that can be the temperature, the pressure, and the ultrasonic treatment, respectively, where the pressure and the ultrasonic treatment is applied from the start of the eutectic reaction until the end of the reaction, and the process condition of the temperature may include increasing stepwise the temperature of the treatment to reach a final reaction temperature, and may include at least one temperature-holding stage before reaching the final reaction temperature. This will be described in detail hereinafter in conjunction with FIGS. 5, 6, and 7.

Under the process conditions of step S5, eutectic melting occurs in the plurality of layers of nano low-melting-point metal materials with different melting points for the first bonding layer and the second bonding layer, such that the melting point is further lowered. Depending on the principle of the eutectic reaction, the melting point of the eutectic compound may be lower than respective melting points of the metal materials thereof. Meanwhile, the reaction temperature may be further lowered by taking advantage of high activities of nano-materials. The applied pressure and ultrasonic oscillation may facilitate movement and diffusion of molecules of a metal material of an upper layer to a lower layer, which is conducive to accelerating the reaction progress, and it is finally achieved that the bonding of the sensor chip and the substrate is performed at the temperature of 30° C. to 180° C., under the pressure of 1 MPa to 8 MPa, and with the ultrasonic oscillation of 10 kHz to 30 kHz to directly connect the sensor chip and the substrate.

After the end of step S5, the temperature, the pressure, and the ultrasonic treatment may be maintained for a period of time, and cooling may then be performed. Next, an adhesive may be coated for encapsulation at edges of an area where the sensor chip is coupled to the substrate and then may be cured, and the packaging of the sensor chip and the substrate is completed.

Below, a method of manufacturing a semiconductor package according to some example embodiments will be described in detail in conjunction with three particular embodiments. Since steps S1 and S4 are substantially the same in the three embodiments, steps S2, S3, and S5 thereof will be described in detail below.

Figure 5:
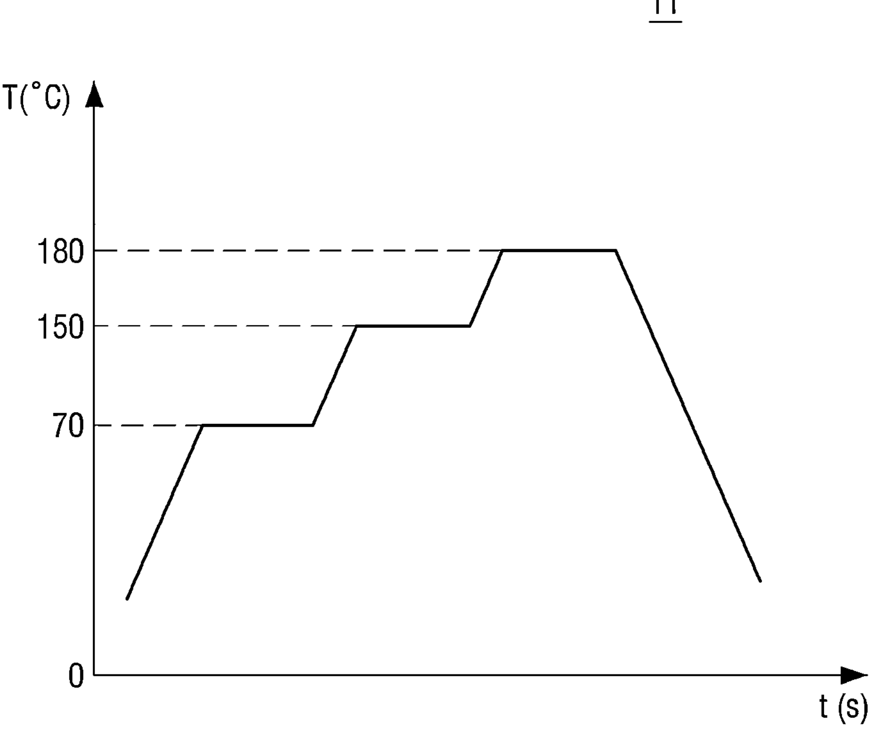
FIG. 5 illustrates a temperature graph in a method of manufacturing a semiconductor package according to a first embodiment.

FIG. 5 illustrates a temperature graph in a method of manufacturing a semiconductor package according to a first embodiment.

In the first embodiment, in step S2, a plurality of layers of nano metal coatings may be sequentially prepared on a surface of a first connection region of a substrate by using silver (Ag), aluminum (Al), magnesium (Mg), and gallium (Ga), to form a first bonding layer having a melting point gradient. In step S3, a plurality of layers of nano metal coatings may be sequentially prepared on a surface of a second connection region of a sensor chip by using gold (Au), silver (Ag), tin (Sn), and indium (In), to form a second bonding layer having a melting point gradient. The process of preparing the coatings may be a nano-coating process or a physical or chemical filming process commonly used and mentioned above. The nano-metal materials may be selected to have a gradient that the melting points thereof decrease as farther away from the first or second connection region. However, the "gradient" described herein does not mean the melting points are necessary to be decreased layer by layer, as long as the melting points of respective layers of the finally prepared nano-coating exhibit a decreasing trend as a whole, which falls within the protection scope of the present inventive concepts.

In step 5, the treatment may be performed by heating according to the temperature graph T1, applying a pressure of 1 MPa, and using an ultrasonic of 30 kHz. As illustrated in FIG. 5, the temperature graph T1 may include three temperature-rising stages and two temperature-holding stages before reaching a final reaction temperature of 180° C. From the start of the reaction, a first temperature-rising stage passes through for raising the temperature to 70° C., and a first temperature-holding stage passes through at 70° C. Then, a second temperature-rising stage passes through for raising the temperature to 150° C., and a second temperature-holding stage passes through at 150° C. Then, a third temperature-rising stage passes through for raising the temperature to the final reaction temperature of 180° C. This process characteristic of increasing stepwise the reaction temperature and passing through a plurality of temperature-holding stages may facilitate the diffusion of the molecules of the layers of nano-metal materials with different melting points of the first and second bonding layers to lower layers.

The plurality of temperature-holding stages may provide sufficient time for a eutectic bonding reaction, ensure the eutectic bonding reaction to be stably performed, and improve the quality of the obtained eutectic, thereby improving the reliability of the semiconductor package.

After the end of step S5, the final reaction temperature of 180° C., the applied pressure, and the ultrasonic treatment may be maintained for a period of time, and cooling may then be performed, which respectively correspond to a third temperature-holding stage and a subsequent temperature-lowering stage shown in FIG. 5. Next, subsequent processes such as an adhesive coating and a curing are performed, and the packaging is completed.

Figure 6:
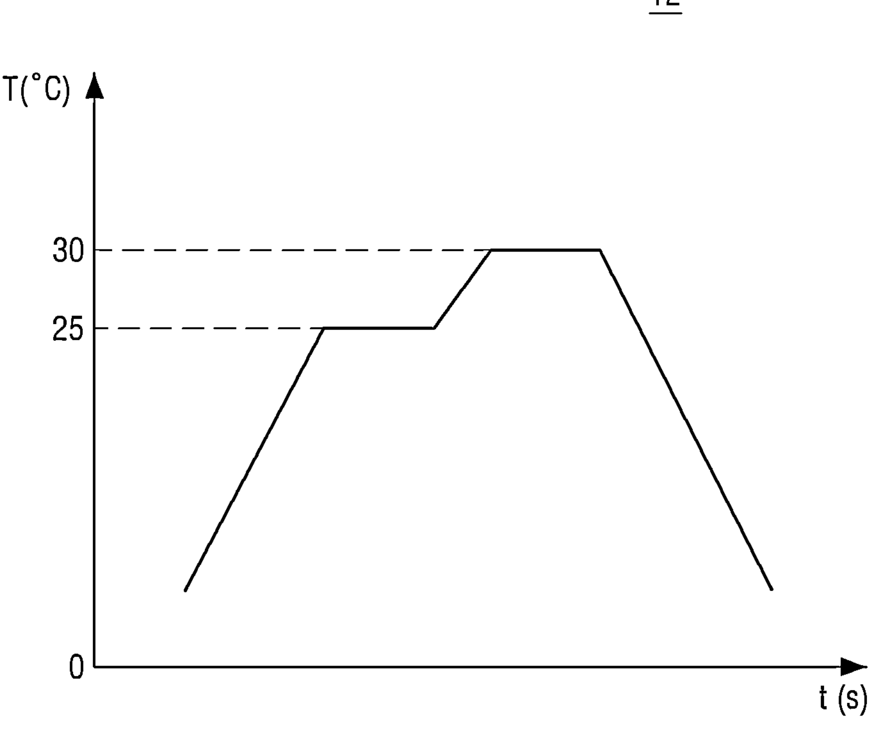
FIG. 6 illustrates a temperature graph in a method of manufacturing a semiconductor package according to a second embodiment.

FIG. 6 illustrates a temperature graph in a method of manufacturing a semiconductor package according to a second embodiment.

In the second embodiment, in step S2, a plurality of layers of nano metal coatings may be sequentially prepared on a surface of a first connection region of a substrate by using lithium (Li), bismuth-tin (Bi—Sn) alloy, and gallium (Ga), to form a first bonding layer having a melting point gradient. In step S3, a plurality of layers of nano metal coatings may be sequentially prepared on a surface of a second connection region of a sensor chip by using tin (Sn), lead-tin (Pb—Sn) alloy, and indium (In), to form a second bonding layer having a melting point gradient.

In step 5, the treatment may be performed by heating according to the temperature graph T2, applying a pressure of 8 MPa, and using an ultrasonic of 30 kHz. As illustrated in FIG. 6, the temperature graph T2 may include two temperature-rising stages and one temperature-holding stage before reaching a final reaction temperature of 30° C. From the start of the reaction, a first temperature-rising stage passes through for raising the temperature to 25° C., and a first temperature-holding stage passes through at 25° C. A second temperature-rising stage passes through for raising the temperature to the final reaction temperature of 30° C. This process achieves a low-temperature eutectic reaction and may lower the reaction temperature to a room temperature state, which may significantly simplify the process, save energy, and reduce cost, and accordingly a semiconductor package with an excellent reliability may be obtained.

After the end of step S5, the final reaction temperature of 30° C., the applied pressure, and the ultrasonic treatment may be maintained for a period of time, and cooling may then be performed, which respectively correspond to a second temperature-holding stage and a subsequent temperature-lowering stage shown in FIG. 6. Next, subsequent processes such as an adhesive coating and a curing are performed, and the packaging is completed.

Figure 7:
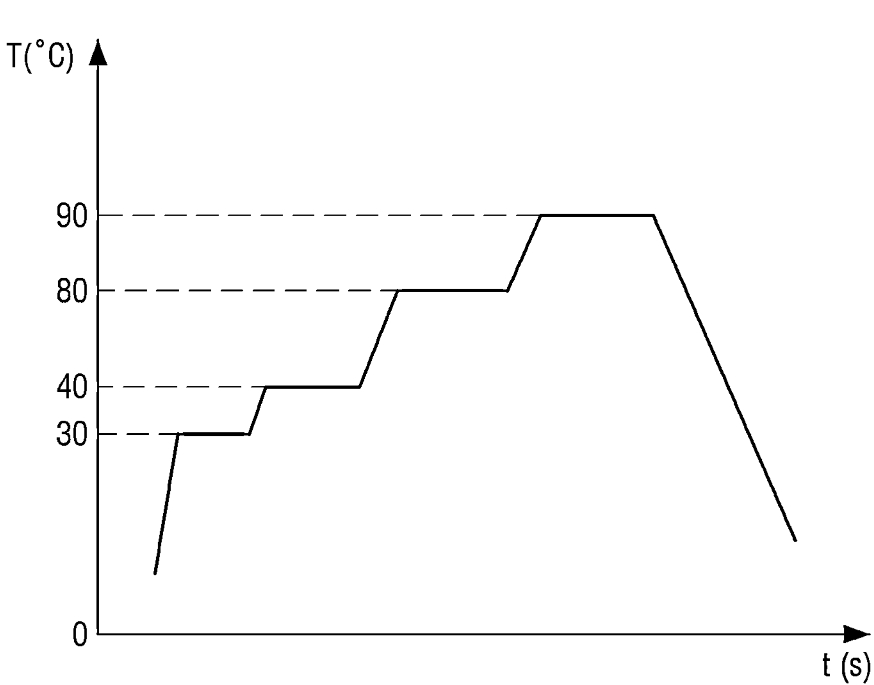
FIG. 7 illustrates a temperature graph in a method of manufacturing a semiconductor package according to a third embodiment.

FIG. 7 illustrates a temperature graph in a method of manufacturing a semiconductor package according to a third embodiment.

In the third embodiment, in step S2, a plurality of layers of nano metal coatings may be sequentially prepared on a surface of a first connection region of a substrate by using aluminum (Al), antimony (Ag), bismuth-lead (Bi—Pb) alloy, and gallium (Ga), to form a first bonding layer having a melting point gradient. In step S3, a plurality of layers of nano metal coatings may be sequentially prepared on a surface of a second connection region of a sensor chip by using copper (Cu), magnesium (Mg), tin (Sn), and lead (Pb), to form a second bonding layer having a melting point gradient.

In step 5, the treatment may be performed by heating according to the temperature graph T3, applying a pressure of 4 MPa, and using an ultrasonic of 20 kHz. As illustrated in FIG. 7, the temperature graph T3 may include four temperature-rising stages and three temperature-holding stages before reaching a final reaction temperature of 90° C. From the start of the reaction, a first temperature-rising stage passes through for raising the temperature to 30° C., and a first temperature-holding stage passes through at 30° C. Then, a second temperature-rising stage passes through for raising the temperature to 40° C., and a second temperature-holding stage passes through at 40° C. Then, a third temperature-rising stage passes through for raising the temperature to 80° C., and a third temperature-holding stage passes through at 80° C. Then, a fourth temperature-rising stage passes through for raising the temperature to the final reaction temperature of 90° C. As described above, this process characteristic of increasing stepwise the reaction temperature and passing through a plurality of temperature-holding stages may obtain a eutectic of high quality, thereby improving the reliability of the semiconductor package.

After the end of step S5, the final reaction temperature of 90° C., the applied pressure, and the ultrasonic treatment may be maintained for a period of time, and cooling may then be performed, which respectively correspond to a fourth temperature-holding stage and a subsequent temperature-lowering stage shown in FIG. 7. Next, subsequent processes such as an adhesive coating and a curing are performed, and the packaging is completed.

Below, a semiconductor package obtained by using the method of manufacturing the semiconductor package according to some example embodiments and an imaging apparatus including the same will be described in detail with reference to FIGS. 8-11.

Figure 8:
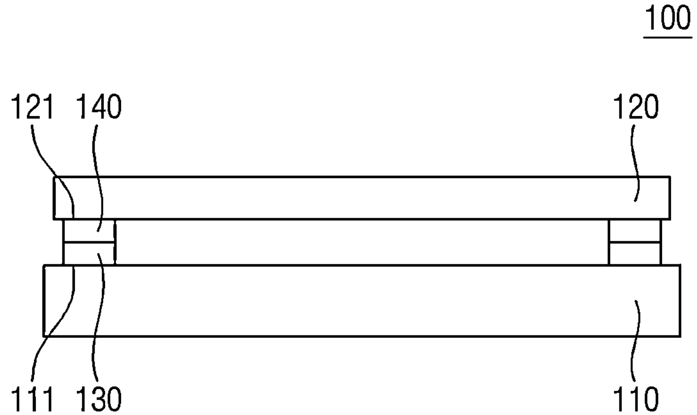
FIG. 8 illustrates a schematic structural view of a semiconductor package according to an example embodiment.

FIG. 8 illustrates a schematic structural view of a semiconductor package according to an example embodiment. As illustrated in FIG. 8, the semiconductor package 100 according to the first embodiment includes a substrate 110 including a first connection region 111 disposed thereon, a sensor chip 120 including a second connection region 121 disposed thereon, a first bonding layer 130 disposed on the first connection region 111, and a second bonding layer 140 disposed on the second connection region 121. The substrate 110 and the sensor chip 120 is coupled to each other by forming a eutectic from the first bonding layer 130 and the second bonding layer 140. The first bonding layer 130 and the second bonding layer 140 each include a plurality of layers of nano low-melting-point metal materials with different melting points to have a melting point gradient.

The semiconductor package 100 of the first embodiment in FIG. 8 may be a package having a COB package structure. In an implementation, the substrate 110 may be a substrate of any type and any material that is commonly used for a semiconductor package in the art. The first connection region 111 may be disposed directly on or embedded on the substrate 110. For example, the first connection region 111 may be disposed on an upper surface of the substrate 110. However, the embodiment is not limited thereto, and the first connection region may also be disposed on a lower surface of the substrate.

In an implementation, the first connection region 111 may be disposed in plural, and may be conductive pads or conductive bonding pads, or may be regions that can be electrically connected to conductive pads or conductive bonding pads. The first connection region 111 may be disposed at an edge portion(s) of the substrate 110. However, the embodiment is not limited thereto, and the first connection region may also be disposed at a center of the substrate.

In an implementation, the sensor chip 120 may be any type of image sensor chip commonly used in an imaging apparatus of an electronic product in the art. The second connection region 121 may be disposed on the sensor chip 120. For example, the second connection region 121 may be disposed directly on or embedded on a lower surface of the sensor chip 120. However, the embodiment is not limited thereto, and the second connection region may also be disposed on an upper surface of the sensor chip.

In an implementation, the second connection region 121 may be disposed in plural, and may be conductive pads or conductive bonding pads, or may be regions that can be electrically connected to conductive pads or conductive bonding pads. The second connection region 121 may be disposed at an edge portion(s) of the sensor chip 120. However, the embodiment is not limited thereto, and the second connection region may also be disposed at a center of the sensor chip.

In an implementation, the positions of the first connection region 111 and the second connection region 121 may correspond to each other, such that the first bonding layer 130 and the second bonding layer 140 may be aligned when the substrate 110 and the sensor chip 120 overlap with each other, thereby preventing or reducing the chances of a poor connection due to the misalignment of the bonding layers and an electronic performance defect of the package resulted therefrom.

In an implementation, the first bonding layer 130 and the second bonding layer 140 may be disposed on the first connection region 111 and the second connection region 121, respectively, by a coating process. Here, the coating process may be a process of preparing a nano-coating that is commonly used in the related art. The coating process may also be a physical or chemical filming process commonly used in the related art, such as a chemical vapor deposition process, a physical sputtering process, or the like. In an implementation, the first bonding layer 130 and the second bonding layer 140 may be formed of materials with nano-scaled thicknesses, which are capable of forming a eutectic at a low temperature. For example, the substrate 110 and the sensor chip 120 may be coupled to each other by forming a eutectic through a eutectic melting at a lower temperature implemented by the first and second bonding layers 130 and 140.

In an implementation, the layers of nano low-melting-point metal materials for forming each of the first and second bonding layers 130 and 140 may include at least two metal layers, for example, three, four, or more metal layers. The melting points of the metal layers may decrease as farther away from the first connection region 111 or the second connection region 121 to form a melting point gradient.

In an implementation, each of the layers of nano low-melting-point metal materials for forming either of the first and second bonding layers 130 and 140 may include one of gold (Au), silver (Ag), aluminum (Al), copper (Cu), zinc (Zn), tin (Sn), lead (Pb), antimony (Sb), bismuth (Bi), lithium (Li), indium (In), magnesium (Mg), gallium (Ga), cadmium (Cd), and an alloy thereof. In an implementation, each of the layers of the nano low-melting-point metal materials may have a thickness of 10 nm to 800 nm. In an implementation, the first bonding layer 130 and the second bonding layer 140 may be formed of the same material or different materials selected from the nano low-melting-point metals or alloys described above.

Figure 9:
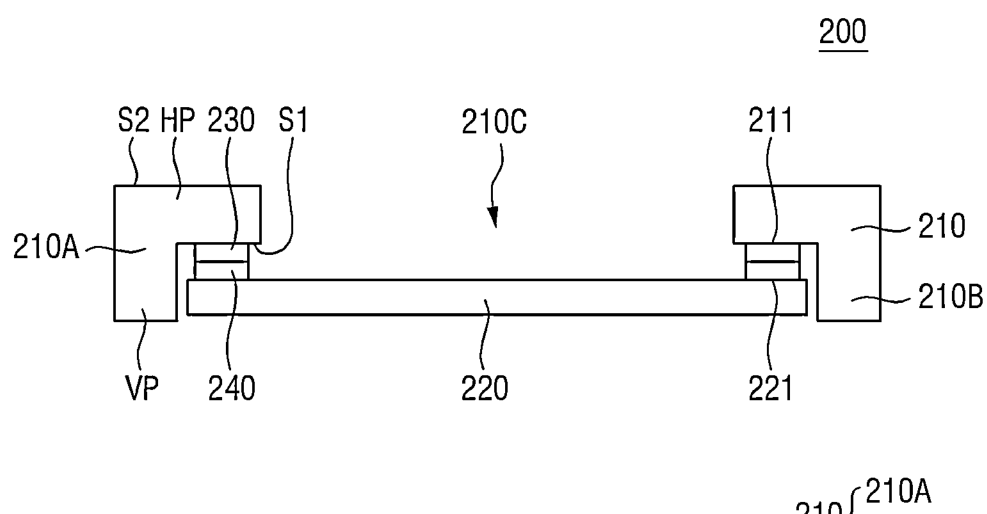
FIG. 9 illustrates a schematic structural view of a semiconductor package according to another example embodiment.

FIG. 9 illustrates a schematic structural view of a semiconductor package according to another example embodiment. The semiconductor package illustrated in FIG. 9 has a structure similar to that of the semiconductor package illustrated in FIG. 8, except for a difference in shape and configuration of the substrate. As such, the difference therebetween will be mainly described below.

As illustrated in FIG. 9, the semiconductor package 200 according to another example embodiment includes a substrate 210 including a first connection region 211 disposed thereon, a sensor chip 220 including a second connection region 221 disposed thereon, a first bonding layer 230 disposed on the first connection region 211, and a second bonding layer 240 disposed on the second connection region 221. The substrate 210 and the sensor chip 220 is coupled to each other by forming a eutectic from the first bonding layer 230 and the second bonding layer 240. The first bonding layer 230 and the second bonding layer 240 each include a plurality of layers of nano low-melting-point metal materials with different melting points to have a melting point gradient.

The semiconductor package 200 of the example embodiment in FIG. 9 may be a package having a flip-chip package structure. In an implementation, the substrate 210 may include a first portion 210A and a second portion 210B, each of which is in an inverted L shape. The first portion 210A and the second portion 210B may be disposed opposite to each other so that a window 210C is formed. The sensor chip 220 may be internally positioned in the window 210C.

In an implementation, the first connection region 211 may be located on inner surfaces of the first and second portions 210A and 210B of the substrate 210. For example, each of the first and second portions 210A and 210B may include a horizontal portion HP extending in a horizontal direction and a vertical portion VP extending in a vertical direction. The horizontal portion HP may have an inner surface S1 facing the sensor chip 220 and an outer surface S2 toward the outside. The first connection region 211 on the first portion 210A and the second portion 210B of the substrate 210 may be disposed on the inner surfaces S1 of the horizontal portions HP of the first portion 210A and the second portion 210B, respectively.

Still referring to FIG. 9, in an implementation, the second connection region 221 may be located on an upper surface of the sensor chip 220. The first bonding layer 230 and the second bonding layer 240 may be aligned and bonded with each other in the vertical direction. For example, the second connection region 221 may be located at an edge portion(s) of the upper surface of the sensor chip 220. When the sensor chip 220 is internally positioned in the window 210C, the first connection region 211 and the second connection region 221 may face to and be aligned with each other in the vertical direction, such that no misalignment occurs between the first and second bonding layers 230 and 240 during their attachment and tight compression, thereby preventing or reducing the chances of deterioration of the electronic performance of the package.

After the substrate 210 and the sensor chip 220 are coupled to each other, the first and second bonding layers 230 and 240 are shielded by the horizontal portions HP of the substrate 210, thereby protecting the connection portions from being damaged by external factors, and improving the reliability of the package.

Figure 10:
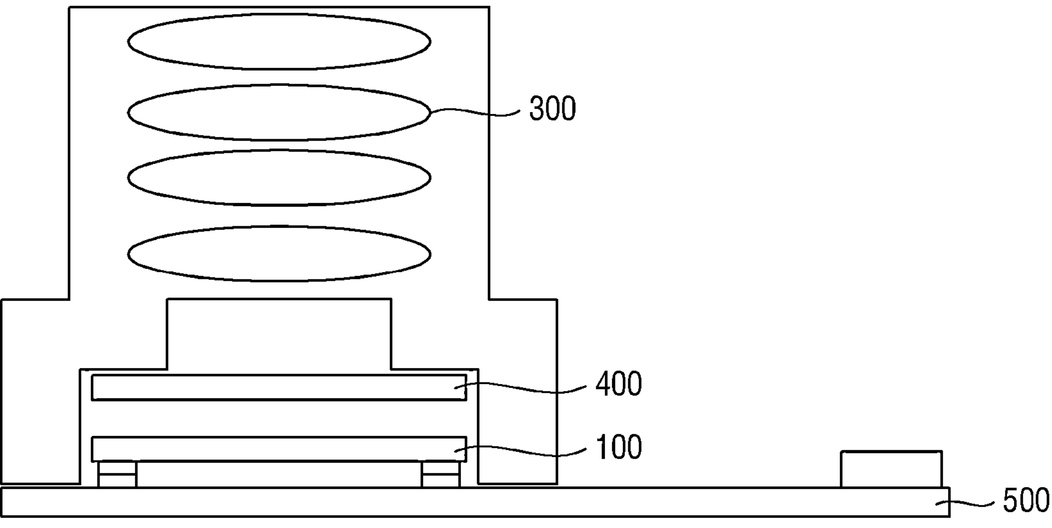
FIG. 10 illustrates a schematic structural view of an imaging apparatus according to an example embodiment.
Figure 11:
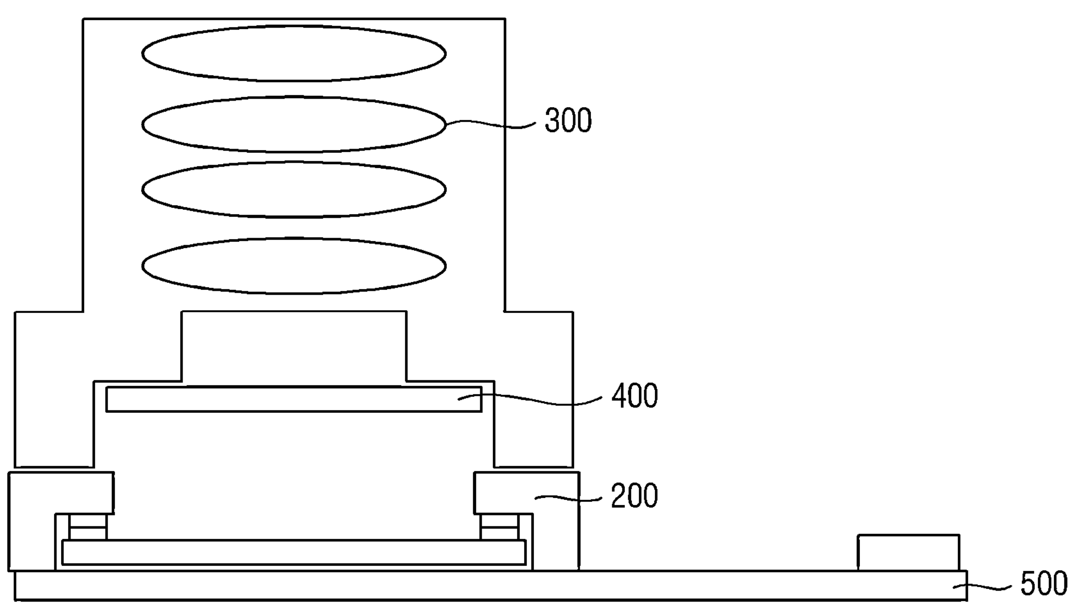
FIG. 11 illustrates a schematic structural view of an imaging apparatus according to another example embodiment.

FIG. 10 illustrates a schematic structural view of an imaging apparatus according to an example embodiment. FIG. 11 illustrates a schematic structural view of an imaging apparatus according to another example embodiment. The imaging apparatus includes a camera module. The camera module of FIG. 10 includes the semiconductor package 100 according to the example embodiment illustrated in FIG. 8. The camera module of FIG. 11 includes the semiconductor package 200 according to the another example embodiment illustrated in FIG. 9. In addition, the camera module may further include lens 300, a filter 400, a wiring board 500, etc. For example, the wiring board 500 may be a rigid PCB circuit board, or may be a flex-rigid circuit board or a flexible printed circuit board.

The semiconductor packages according to the example embodiments may be applied to the camera module of the imaging apparatus. Compared with conventional packaging processes for camera chips, the packaging process for camera chips provided by the present inventive concepts does not need bonding wires or bonding balls, and is favorable to the ultra-thinning of the camera package, thereby addressing the problems of the ultra-thin packaging of the camera module.

By ways of summation and review, the example embodiments of the present inventive concepts prepare respective nano low-temperature eutectic alloys on a connection region of a sensor chip and a corresponding region of a substrate, respectively, by using a low-temperature eutectic alloy technique and a gradient nano-coating technique, and may achieve metal eutectic melting at a lower temperature by using a low-temperature eutectic technique. Meanwhile, a temperature for the metal eutectic melting may be further decreased by using the high activities of nano-materials. It is finally achieved that the bonding of the chip and the substrate is performed at a temperature of 30° C. to 180° C., under a pressure of 1 MPa to 8 MPa, and with ultrasonic oscillation of 10 kHz to 30 kHz, to directly connect the sensor chip and the substrate. The packaging process of the example embodiments requires neither bonding wires nor bonding balls of a conventional packaging process nor complicated processes such as high temperature, high pressure, etc., and only need to be carried out at a lower temperature, or even at room temperature, to achieve packaging of a chip and a substrate, thereby significantly decreasing a thickness of a camera package to conduce to ultra-thinning of a camera package, and having the advantageous effects such as small investment in production equipment, low energy consumption in production, low cost, etc.

While the embodiments of the inventive concepts have been illustrated and described herein, it will be apparent to those skilled in the art that various modifications and variations may be made without departing from the spirit and scope of the inventive concepts as set forth in the following claims.

What is claimed is:

1. A semiconductor package, comprising:

a substrate including a first connection region;

a sensor chip including a second connection region; and a eutectic coupling the substrate and the sensor chip to each other, the eutectic formed from a first bonding layer on the first connection region, and a second bonding layer on the second connection region, wherein the first bonding layer and the second bonding layer each have a melting point gradient and include a plurality of layers of nano low-melting-point metal materials, and wherein each of the plurality of layers of nano low-melting-point metal materials have a thickness of 10 nm to 800 nm.

2. The semiconductor package as claimed in claim 1, wherein the plurality of layers of nano low-melting-point metal materials of each of the first bonding layer and the second bonding layer have melting points that decrease with distance away from a respective one of the first connection region and the second connection region.

3. The semiconductor package as claimed in claim 1, wherein the substrate includes a first portion and a second portion each in an inverted L shape, the first portion and the second portions being disposed opposite to each other to form a window, and the sensor chip being internally positioned in the window.

4. The semiconductor package as claimed in claim 2, wherein each of the plurality of layers of nano low-melting-point metal materials of each of the first bonding layer and the second bonding layers includes one of gold (Au), silver (Ag), aluminum (Al), copper (Cu), zinc (Zn), tin (Sn), lead (Pb), antimony (Sb), bismuth (Bi), lithium (Li), indium (In), magnesium (Mg), gallium (Ga), cadmium (Cd), and an alloy thereof.

5. The semiconductor package as claimed in claim 1, wherein the nano low-melting-point metal materials of each of the first bonding layer and the second bonding layer have melting points that decrease with distance away from a respective one of the first connection region and the second connection region.

6. An imaging apparatus, comprising:

a camera module including a lens, a filter, and a semiconductor package, the semiconductor package including a substrate including a first connection region, a sensor chip including a second connection region, and a eutectic coupling the substrate and the sensor chip to each other, the eutectic formed from a first bonding layer on the first connection region, and a second bonding layer on the second connection region, wherein the first bonding layer and the second bonding layer each have a melting point gradient and include a plurality of layers of nano low-melting-point metal materials, and wherein each of the plurality of layers of nano low-melting-point metal materials have a thickness of 10 nm to 800 nm.

7. The imaging apparatus as claimed in claim 6, wherein the plurality of layers of nano low-melting-point metal materials of each of the first bonding layer and the second bonding layer have melting points that decrease with distance away from respective one of the first connection region and the second connection region.

8. The imaging apparatus as claimed in claim 6, wherein the substrate includes a first portion and a second portion each in an inverted L shape, the first portion and the second portion being disposed opposite to each other to form a window, and the sensor chip being internally positioned in the window.

9. The imaging apparatus as claimed in claim 7, wherein each of the plurality of layers of nano low-melting-point metal materials of each of the first bonding layer and the second bonding layers includes one of gold (Au), silver (Ag), aluminum (Al), copper (Cu), zinc (Zn), tin (Sn), lead (Pb), antimony (Sb), bismuth (Bi), lithium (Li), indium (In), magnesium (Mg), gallium (Ga), cadmium (Cd), and an alloy thereof.

10. The imaging apparatus as claimed in claim 6, wherein the substrate is a wiring board.

11. The imaging apparatus as claimed in claim 8, wherein the substrate is mounted to a wiring board.

12. The imaging apparatus as claimed in claim 6, wherein the nano low-melting-point metal materials of each of the first bonding layer and the second bonding layer have melting points that decrease with distance away from a respective one of the first connection region and the second connection region.

* * * * *